United States Patent
Yang et al.

(10) Patent No.: US 8,212,627 B2
(45) Date of Patent: Jul. 3, 2012

(54) WIDEBAND DIGITALLY-CONTROLLED OSCILLATOR (DCO) AND DIGITAL BROADCASTING RECEIVER HAVING THE SAME

(75) Inventors: Li Yang, Beijing (CN); Hyun-koo Kang, Yongin-si (KR); Dae-yeon Kim, Suwon-si (KR); LuoSheng Li, Beijing (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 12/711,414

(22) Filed: Feb. 24, 2010

(65) Prior Publication Data

US 2010/0215123 A1    Aug. 26, 2010

(30) Foreign Application Priority Data

Feb. 24, 2009   (KR) .................. 10-2009-0015434

(51) Int. Cl.
*H03B 1/00* (2006.01)
(52) U.S. Cl. ......... 331/179; 331/16; 331/1 A; 331/36 C; 331/117 R; 331/167; 331/117 FE

(58) Field of Classification Search ............... 331/177 V, 331/179, 1 A, 167, 117 R, 117 FE, 16, 34; 327/156, 159
See application file for complete search history.

(56) References Cited

U.S. PATENT DOCUMENTS

| | | | |
|---|---|---|---|
| 6,606,004 B2 * | 8/2003 | Staszewski et al. | 331/17 |
| 7,463,098 B2 * | 12/2008 | Baird et al. | 331/16 |
| 2008/0164957 A1 * | 7/2008 | Herbert | 331/36 C |
| 2009/0108947 A1 * | 4/2009 | Liu | 331/117 FE |

\* cited by examiner

*Primary Examiner* — Arnold Kinkead
(74) *Attorney, Agent, or Firm* — Sughrue Mion, PLLC

(57) ABSTRACT

A wideband digitally-controlled oscillator (DCO) is provided. The wideband DCO includes an active element which is driven by a first digital control signal; a single inductor which is connected to the active element in parallel, and comprises fixed inductance; and a plurality of capacitors which are connected to the single inductor in parallel, and vary operating frequency by being selectively turned on or off by a second digital control signal. Accordingly, the wideband DCO capable of operating in a wideband frequency range using a single inductor is provided, and if the wideband DCO is implemented using a single integrated circuit (IC) chip, the size of chip is reduced as the single inductor is used.

9 Claims, 6 Drawing Sheets

WIDEBAND DIGITALLY-CONTROLLED OSCILLATOR (DCO) AND DIGITAL BROADCASTING RECEIVER HAVING THE SAME

CROSS-REFERENCE TO RELATED APPLICATIONS

This application claims priority under 35 U.S.C. §119 from Korean Patent Application No. 10-2009-0015434, filed on Feb. 24, 2009, in the Korean Intellectual Property Office, the disclosure of which is incorporated herein by reference in its entirety.

BACKGROUND OF THE INVENTION

1. Field of the Invention

Apparatuses and methods consistent with the exemplary embodiments of the present invention relate to a wideband digitally-controlled oscillator (DCO) and a digital broadcasting receiver having the same, and more particularly, to a wideband digitally-controlled oscillator which not only occupies less space but also operates within a wideband frequency range and a digital broadcasting receiver having the same.

2. Description of the Related Art

A general phase-locked loop (PLL) is used to obtain a signal having fixed phase and frequency by detecting and adjusting variation of the phase and frequency.

Recently, a digital PLL has been widely used, and a digitally controlled oscillator (DCO) is used for the digital PLL.

A related-art DCO is based on an LC oscillator and thus obtains oscillation frequency with reference to inductance L and capacitance C as in Equation 1.

$$f = \frac{1}{2\pi\sqrt{LC}} \quad [\text{EQN. 1}]$$

That is, a related-art DCO based on an LC oscillator tunes oscillation frequency by varying capacitance or inductance.

However, if a single DCO is used, the range of operating frequency is limited. In order to implement a wideband DCO according to a related-art method, a plurality of DCOs having different operating frequency ranges, including a first DCO operating from 1 GHz to 2 GHz, a second DCO operating from 2 GHz to 3 GHz, and a third DCO operating from 3 GHz to 4 GHz, are arranged in an array structure, each DCO is selected suitable for the operating frequency, and thus a wideband DCO having operating frequency ranging from 1 GHz to 4 GHz is implemented.

The wideband DCO having the above feature uses a plurality of DCOs operating in different operating frequencies. Therefore, although operating frequency is adjusted by varying capacitance while inductance is fixed, the wideband DCO should include a plurality of inductors.

If a wideband DCO is fabricated in a form of a single integrated circuit (IC) chip, inductors occupies most of the IC chip. Accordingly, it is difficult to miniaturize the size of IC chip using a related-art method.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

Exemplary embodiments of the present invention provide a wideband digitally controlled oscillator (DCO) having a single inductor and a digital broadcasting receiver having the same.

According to an exemplary aspect of the present invention, there is provided a wideband digitally-controlled oscillator (DCO), including an active element which is driven by a first digital control signal; a single inductor which is connected to the active element in parallel, and comprises fixed inductance; and a plurality of capacitors which are connected to the single inductor in parallel, and vary operating frequency by being selectively turned on or off by a second digital control signal.

The active element may include a plurality of pairs of transistors which are controlled to be turned on or off by the first digital control signal.

The wideband DCO may further include a plurality of current source units which are controlled to be turned on or off by a third digital control signal, and supply current to the active element.

The wideband DCO may further include a controlling unit which outputs the first through third digital control signals.

Each transistor of each pair of transistors may be disposed to face each other, wherein a first terminal, a second terminal, and a third terminal of the transistors disposed on a side are connected to a first node, a second node, and a third node, respectively, and a first terminal, a second terminal, and a third terminal of the transistors disposed on opposite side are connected to a fourth node, a fifth node, and a sixth node, respectively, and wherein the first node is connected to the fifth node, the second node is connected to the fourth node, and the third node is connected to the sixth node.

The single inductor may be connected between the first node and the fourth node.

According to an exemplary aspect of the present invention, there is provided a digital broadcasting receiver, including a wideband digitally-controlled oscillator (DCO) which provides wideband resonant frequency, using a plurality of capacitors which are selectively turned on or off according to a single common inductor having fixed inductance and a digital control signal and provide variable capacitance; and a communication unit which performs wideband communication using the wideband resonant frequency.

The wideband DCO may include an active element which is driven by a first digital control signal; a single inductor which is connected to the active element in parallel, and comprises fixed inductance; and a plurality of capacitors which are connected to the single inductor in parallel, and vary operating frequency by being selectively turned on or off by a second digital control signal.

The active element of the wideband DCO may include a plurality of pairs of transistors which are controlled to be turned on or off by the first digital control signal.

The wideband DCO may further include a plurality of current source units which are controlled to be turned on or off by a third digital control signal, and supply current to the active element.

The wideband DCO may further include a controlling unit which outputs the first through third digital control signals.

Each transistor of each pair of transistors may be disposed to face each other, wherein a first terminal, a second terminal, and a third terminal of the transistors disposed on a side are connected to a first node, a second node, and a third node, respectively, and a first terminal, a second terminal, and a third terminal of the transistors disposed on opposite side are connected to a fourth node, a fifth node, and a sixth node, respectively, and wherein the first node is connected to the fifth node, the second node is connected to the fourth node, and the third node is connected to the sixth node.

The single inductor of the wideband DCO may be connected between the first node and the fourth node.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
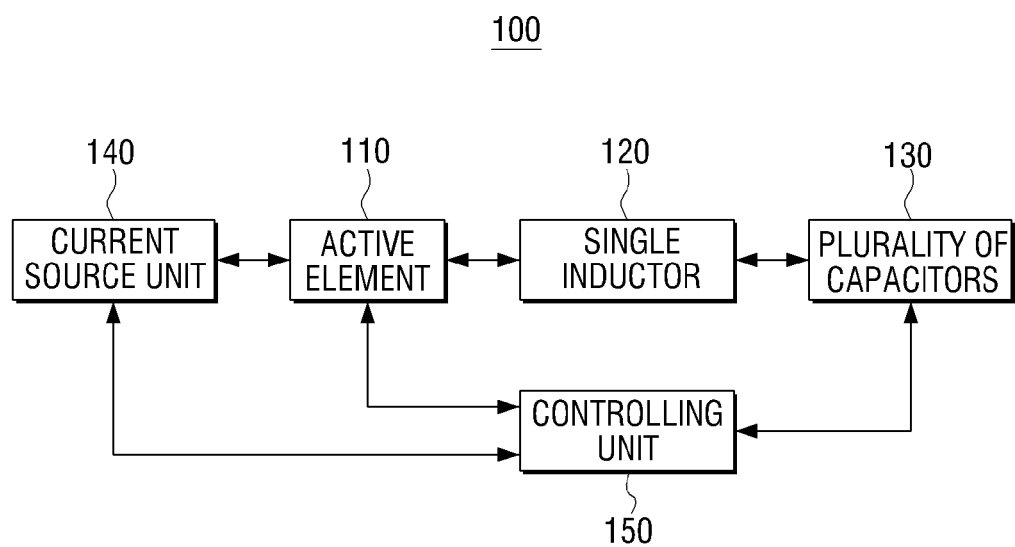
FIG. 1 is a block diagram illustrating a wideband digitally controlled oscillator (DCO) according to an exemplary embodiment of the present invention.

Certain exemplary embodiments of the present invention will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the invention. Thus, it is apparent that the present invention can be carried out without those specifically defined matters. Also, well-known functions or constructions are not described in detail since they would obscure the invention with unnecessary detail.

FIG. 1 is a block diagram illustrating a wideband digitally controlled oscillator (DCO) according to an exemplary embodiment of the present invention. Referring to FIG. 1, a wideband digitally controlled oscillator (DCO) 100 comprises an active element 110, a single inductor 120, a plurality of capacitors 130, a current source unit 140, and a controlling unit 150. Alternatively, the wideband DCO 100 may also be implemented with only the active element 110, the single inductor 120, and the plurality of capacitors 130.

The active element 110 is driven by a first digital control signal.

The single inductor 120 is connected to the active element 110 in parallel, and has fixed inductance.

The plurality of capacitors 130 are connected to the single inductor 120 in parallel. The plurality of capacitors 130 are selectively turned on or off according to a second digital control signal and thus vary operating frequency of the wideband DCO 100.

Accordingly, the wideband DCO 100 capable of operating in a wideband frequency range may be implemented using the single inductor 120, and if the wideband DCO 100 is fabricated as a single integrated circuit (IC) chip, the size of IC chip is miniaturized as the single inductor 120 is used in this exemplary embodiment of the present invention.

The current source units 140 may be a plurality of current source units 140 that are turned on or off by a third digital control signal and thus supply current to the active element 110. If the plurality of current source units 140 are not provided, voltage may be directly supplied to the active element 110. As the plurality of current source units 140 may supply constant current, it may obviate voltage instability induced by noise.

The controlling unit 150 outputs the first through third digital control signals. The first, second, and third digital control signals may be individually controlled. The operating principle of the digital control signals is the same, and will be explained later.

As the active element 110, the plurality of capacitors 130, and the current source unit 140 may be controlled by the digital control signals, the exemplary embodiment of the present invention may provide the wideband DCO 100 which is less affected from external effects such as supply voltage or temperature variation.

Figure 2:
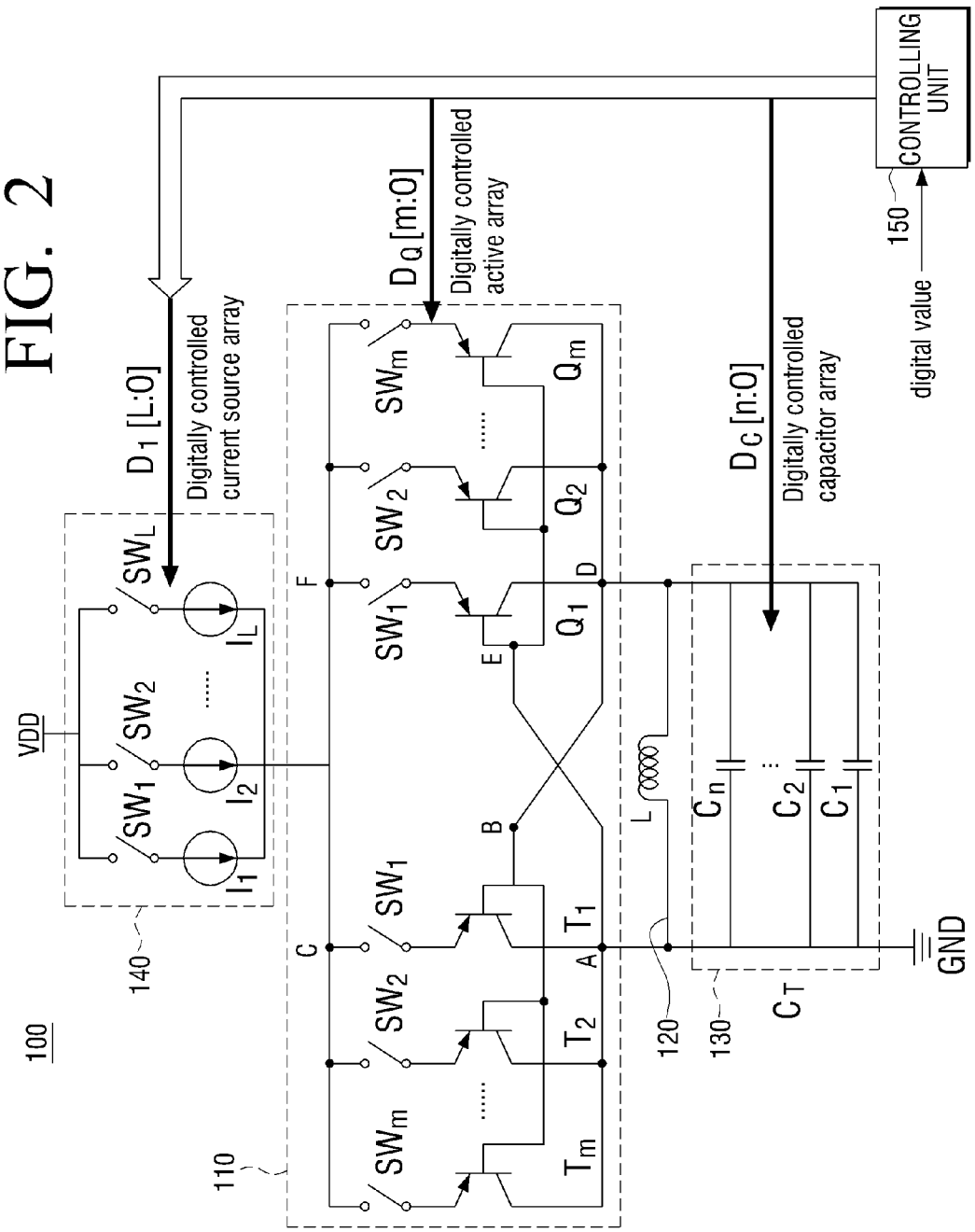
FIG. 2 illustrates the wideband (DCO) of FIG. 1 in detail.

FIG. 2 illustrates the wideband (DCO) 100 of FIG. 1 in detail. Referring to FIG. 2, the wideband DCO 100 may determine oscillation frequency (or operating frequency) as in Equation 1 by performing inductance-capacitance (LC) resonance using inductance L of the single inductor 120 and the entire capacitance $C_T$ of the plurality of capacitors 130. Some or all of the plurality of capacitors 130 may be selected to be operated according to the second digital control signal of the controlling unit 150, and accordingly the entire capacitance $C_T$ of the plurality of capacitors 130 may be varied.

For example, the controlling unit 150 may be implemented so that if a digital value of 3 bits, for example "000", is input, the controlling unit 150 decodes digital value "000" to decimal value "1", and if a digital value of 3 bits, for example "001", is input, the controlling unit 150 decodes digital value "001" to decimal value "2". In this situation, if it is predetermined that decoded value "1" causes one $C_1$ of the plurality of capacitors 130 to be turned on, the controlling unit 150 may generate and output the second digital control signal in which digital control signal "1" is applied to the capacitor $C_1$, and digital control signal "0" is applied to the other capacitors $C_2$ to $C_n$. The respective capacitors $C_1$ to $C_n$ comprise a switching element (not shown) which is connected to each capacitor in a series, respectively. The switching element may be implemented by using a single transistor or by combining a plurality of transistors, or may be implemented with various switching elements other than a transistor. If digital value "1" is input, the switching element is closed, and if digital value "0" is input, the switching element is open.

If digital value "000" is input, the controlling unit 150 outputs a control signal to close one capacitor $C_1$, and if digital value "001" is input, the controlling unit 150 outputs a control signal to close two capacitors $C_1$ and $C_2$. Accordingly, if an operating frequency is set to 2 GHz while digital value "000" is input, operating frequency may be set to 1.9 GHz while digital value "001" is input.

As described above, the controlling unit 150 may further comprise a decoder (not shown) which decodes a digital value. The controlling unit 150 may be embodied using any controller which can control each capacitor to be turned on or off using digital control signal "0" or "1".

The active element 110 and the current source unit 140 may also be controlled according to digital control signal "0" or "1". Switches $SW_1$, $SW_2$, ... $SW_m$ of the active element 110 and switches $SW_1$, $SW_2$, ... $SW_l$ of the current source unit 140 may be implemented using various switching elements.

The respective capacitors $C_1$ and $C_2$ constituting of the plurality of capacitors 130 may be implemented in a form of capacitor bank which is formed by combining a plurality of capacitors.

The active element 110 may be a pair of transistors which are controlled to be turned on or off according to the first digital control signal.

In the pair of transistors of the active element 110, the transistors are disposed to face each other. Transistors $T_1$, $T_2$, ... $T_m$ disposed on a side may include the first terminal (collector terminal), the second terminal (base terminal), and the third terminal (emitter terminal), respectively, and the terminals may be connected to the first node A, the second node B, and the third node C, respectively. Transistors $Q_1$, $Q_2$, ... $Q_m$ disposed on an opposite side may include the first terminal (collector terminal), the second terminal (base terminal), and the third terminal (emitter terminal), respectively, and the terminals may be connected to the fourth node D, the fifth node E, and the sixth node F, respectively. The first node A is connected to the fifth node E, the second node B is connected to the fourth node D, and the third node C is connected to the sixth node F.

The active element 110 may use MOS transistor instead of Bipolar transistor, and may also use a transistor combining Bipolar and MOS as occasion demands.

The single inductor 120 may be connected between the first node A and the fourth node D.

The active element 110 and the plurality of capacitors 130 are arranged in an array structure, and the corresponding digital control signals may control the active element 110 and the plurality of capacitors 130. Accordingly, the wideband digitally controlled oscillator (DCO) 100 ranging from several frequency to several tens frequency may be provided.

Figure 3:
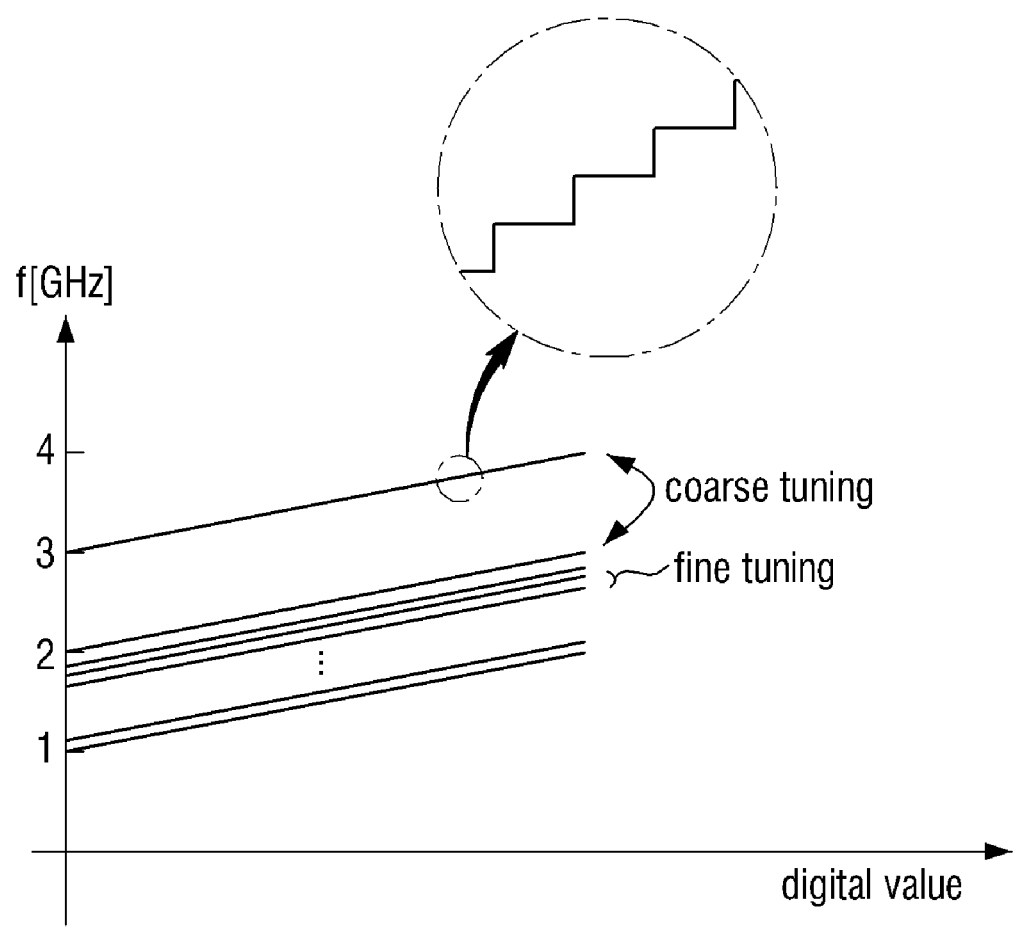
FIG. 3 is a graph illustrating an output waveform of a wideband DCO according to an exemplary embodiment of the present invention.

FIG. 3 is a graph illustrating an output waveform of a wideband DCO according to an exemplary embodiment of the present invention. As the wideband DCO 100 may perform LC oscillation, an output waveform of the wideband DCO 100 may be checked from both ends of the single inductor 120 or both ends of the plurality of capacitors 130.

Referring to FIG. 3, the entire capacitance $C_T$ of the plurality of capacitors 130 are varied, and thus the fine tuning in which the operating frequency is changed from 2.1 GHz to 2.2 GHz may be performed.

Alternatively, the coarse tuning may be performed according to the first digital control signal of the active element 110. For example, in order to change the operating frequency so that the wideband DCO 100 operating at 2 GHz can be operated at 3 GHz, the active element 110 is controlled according to the first digital control signal.

The output frequency according to the digital value is illustrated as a straight line having a slope of constant degree in FIG. 3. However, referring to the enlarged view of FIG. 3, the output frequency may be preferably illustrated to have fixed frequency and phase for each digital value such as "000" or "001".

According to the wideband DCO 100 according to an exemplary embodiment of the present invention as illustrated in FIG. 3, the operating frequency ranging from several GHz to several tens GHz may be output by using the only single inductor 120 having a fixed inductance.

Figure 4A:
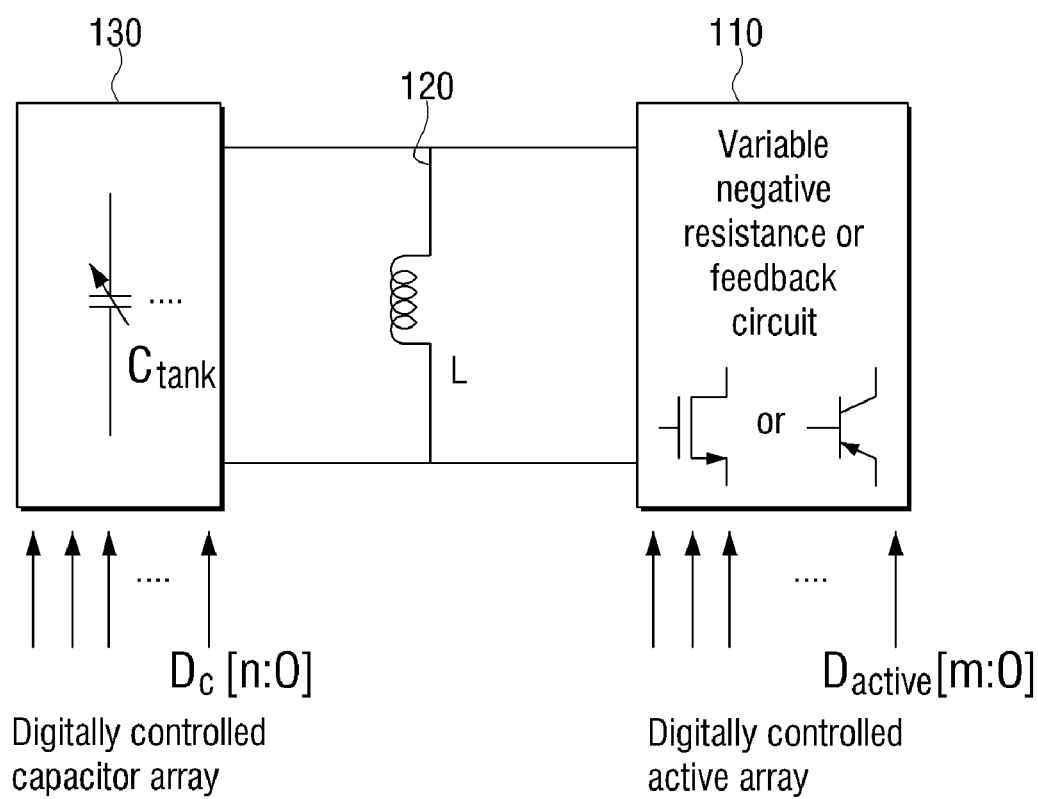
FIG. 4A is a schematic view illustrating the structure of a wideband DCO according to an exemplary embodiment of the present invention.

FIG. 4A is a schematic view briefly illustrating the structure of a wideband DCO according to an exemplary embodiment of the present invention for convenience of description regarding FIG. 1. Referring to FIG. 4A, the active element 110 and the plurality of capacitors 130 may be controlled by the digital control signal.

The active element 110 may be involved in the negative feedback, and comprises plurality of pairs of transistors which obtain negative resistance and enable the LC oscillation circuit to continuously maintain the oscillation.

The DCO having a wideband operating frequency range may be provided by appropriately combining the active element 110 and the plurality of capacitors 130 having the array structure.

Figure 4B:
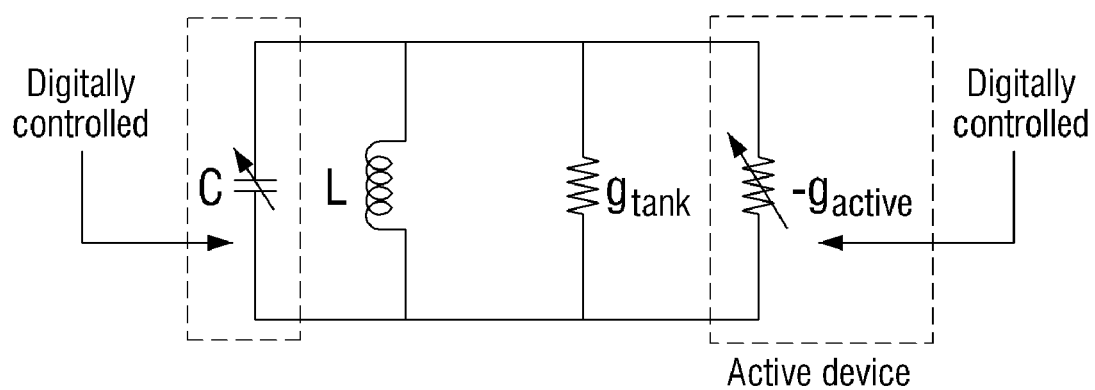
FIG. 4B is a view illustrating an equivalent circuit of that shown in FIG. 4A.

FIG. 4B is a view illustrating an equivalent circuit of that shown in FIG. 4A. Referring to FIG. 4B, as the oscillation frequency of LC oscillation circuit is changed by varying the capacitance, the trans-conductance $g_{tank}$ may be calculated by the LC oscillation circuit using Equation 2 as follows:

$$g_{tank} = \frac{R_{SL}}{\omega^2 L_S^2} \qquad [\text{EQN. 2}]$$

Herein, $R_{SL}$ represents parasitic resistance of the inductor and capacitor,
$\omega$ represents oscillation frequency, and
$L_S$ represents inductance.

Figure 5:
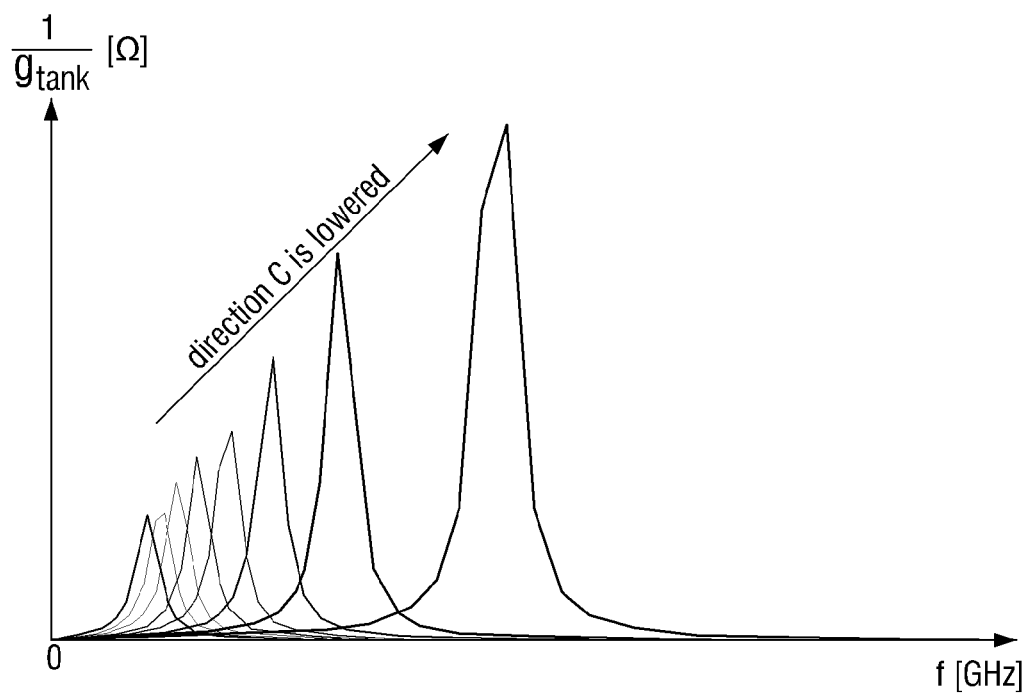
FIG. 5 is a graph illustrating $g_{tank}$ as a function of capacitance.

FIG. 5 is a graph illustrating $g_{tank}$ as a function of capacitance. Y-axis of FIG. 5 is labeled as "$1/g_{tank}$" for convenience of description. Referring to FIG. 5, if the capacitance of Equation 1 becomes low, the oscillation frequency $\omega$ is increased according to Equation 2, and the trans-conductance $g_{tank}$ according to the LC oscillation circuit becomes low. That is, if the capacitance is lowered, $1/g_{tank}$ is increased as shown in FIG. 5.

If the operating frequency is changed due to operation control on the capacitance of the plurality of capacitors 130, the trans-conductance $g_{tank}$ is changed. If the trans-conductance $g_{tank}$ is changed, the oscillation may occur when the oscillation startup condition is satisfied as in Equation 3.

$$g_{active} E_{\alpha min} g_{tank} \alpha_{min} = 1 \qquad [\text{EQN.3}]$$

If Equation 3 is not approved, the oscillation may not occur on the resonant frequency. Accordingly, the active element 110 is turned on or off according to the first digital control signal, and thus if Equation 3 is approved, noise performance is increased, and the wideband DCO 100 may be substantially oscillated.

Accordingly, noise performance may be optimized as in Numerical Formulas 4 and 5.

$$i^2/\Delta f = 4kT\gamma g_m \qquad [\text{EQN.4}]$$

Herein, $i^2/\Delta f$ represents noise,
i represents noise current,
$\Delta f$ represents offset between required frequency and actually produced frequency,
k represents Boltzmann constant,
T represents temperature constant,
$\gamma$ represent body effect coefficient, and
$g_m$ represents trans-conductance.
As described above, Equation 4 represents noise in the frequency domain.

$$V_{tank} = i \frac{\omega^2 L_S^2}{R_{SL}} \qquad [\text{EQN. 5}]$$

Herein, $V_{tank}$ represents amplitude of the output waveform in a time domain, and the other variables represent the same values as those of Equation 2.

Figure 6:
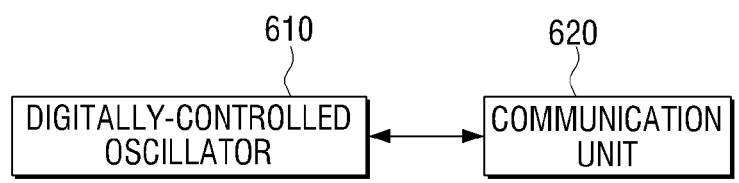
FIG. 6 is a block diagram illustrating a broadcasting receiver according to an exemplary embodiment of the present invention.

FIG. 6 is a block diagram illustrating a broadcasting receiver according to an exemplary embodiment of the present invention. Referring to FIG. 6, the broadcasting receiver 600 comprises a digitally-controlled oscillator 610 and a communication unit 620.

The digitally-controlled oscillator 610 provides wideband resonant frequency, using a plurality of capacitors which are selectively turned on or off according to a single common inductor having fixed inductance and a digital control signal and thus provide variable capacitance.

The communication unit 620 performs wideband communication using wideband resonant frequency.

The broadcasting receiver 600 according to an exemplary embodiment of the present invention may comprise the wideband digitally-controlled oscillator 610 which provides wideband resonant frequency using a single common inductor. Accordingly, the wideband digitally-controlled oscillator 610 may be applied to a digital television (TV), a mobile TV, a digital broadcasting satellite TV, and so on, and may also be applied to an integrated circuit (IC) of a TV tuner.

The operation performed on the wideband digitally-controlled oscillator 610 is the same as that of the wideband DCO 100 explained above, and thus the overlapped description will be omitted.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A wideband digitally-controlled oscillator (DCO), comprising:
   an active element which is driven by a first digital control signal;
   a single inductor which is connected to the active element in parallel, and comprises fixed inductance;
   a plurality of capacitors which are connected to the single inductor in parallel, and change an operating frequency by being selectively turned on or off by a second digital control signal;
   a plurality of current source units which are controlled to be selectively turned on or off by a third digital control signal, and supply current to the active element; and
   a controlling unit which outputs the first through the third digital control signals.

2. The wideband DCO as claimed in claim 1, wherein one transistor of a pair of transistors of the plurality of pairs of transistors, is disposed to face another transistor of the pair of transistors of the plurality of pairs of transistors,
   wherein a first terminal, a second terminal, and a third terminal of the one transistor, disposed on a first side are connected to a first node, a second node, and a third node, respectively, and a first terminal, a second terminal, and a third terminal of the other transistor, disposed on a second side opposite to the first side, are connected to a fourth node, a fifth node, and a sixth node, respectively, and
   wherein the first node is connected to the fifth node, the second node is connected to the fourth node, and the third node is connected to the sixth node.

3. The wideband DCO as claimed in claim 2, wherein the single inductor is connected between the first node and the fourth node.

4. A digital broadcasting receiver, comprising:
   a wideband digitally-controlled oscillator (DCO) which provides wideband resonant frequency according to a single common inductor, using a plurality of capacitors which are selectively turned on or off according to a digital control signal and which provide variable capacitance; and
   a communication unit which performs wideband communication using the wideband resonant frequency,
   wherein the digital control signal is a second digital control signal and the wideband DCO comprises:
   an active element which is driven by a first digital control signal;
   a single inductor which is connected to the active element in parallel, and comprises fixed inductance;
   a plurality of capacitors which are connected to the single inductor in parallel, and change an operating frequency by being selectively turned on or off by the second digital control signal;
   a plurality of current source units which are controlled to be turned on or off by a third digital control signal, and supply current to the active element; and
   a controlling unit which outputs the first through the third digital control signals.

5. The digital broadcasting receiver as claimed in claim 4:
   wherein the active element of the wideband DCO comprises a plurality of pairs of transistors which are controlled to be turned on or off by the first digital control signal.

6. The digital broadcasting receiver as claimed in claim 5, wherein one transistor of a pair of transistors of the plurality of pairs of transistors is disposed to face another transistor of the pair of transistors of the plurality of pairs of transistors,
   wherein a first terminal, a second terminal, and a third terminal of the one transistor disposed on a first side are connected to a first node, a second node, and a third node, respectively, and a first terminal, a second terminal, and a third terminal of the other transistor disposed on a second side opposite to the first side, is connected to a fourth node, a fifth node, and a sixth node, respectively, and
   wherein the first node is connected to the fifth node, the second node is connected to the fourth node, and the third node is connected to the sixth node.

7. The digital broadcasting receiver as claimed in claim 6, wherein the single inductor of the wideband DCO is connected between the first node and the fourth node.

8. A digitally-controlled oscillator (DCO) which generates a variable operating frequency, the DCO comprising:
   a plurality of pairs of transistors driven by a first signal;
   an inductor connected to the plurality of pairs of transistors, the inductor having a fixed inductance; and
   a capacitor bank comprising a plurality of capacitors driven by a second signal,
   wherein the plurality of pairs of transistors, the inductor, and the capacitor bank are connected in parallel, and
   wherein the variable operating frequency is changed by changing a total capacitance of the capacitor bank, the total capacitance being directly proportional to a number of the plurality of capacitors that are turned on by the second signal,
   wherein one of the plurality of pairs of transistors includes a first transistor and a second transistor,
   wherein a first terminal, a second terminal, and a third terminal of the first transistor, are connected to a first node, a second node, and a third node, respectively, and a first terminal, a second terminal, and a third terminal of the second transistor, are connected to a fourth node, a fifth node, and a sixth node, respectively, and wherein the first node is connected to the fifth node, the second node is connected to the fourth node, and the third node is connected to the sixth node.

9. The wideband DCO as claimed in claim 1, wherein the active element comprises a plurality of pairs of transistors which are controlled to be selectively turned on or off by the first digital control signal.

* * * * *